US009500945B1

(12) United States Patent
Ning et al.

(10) Patent No.: US 9,500,945 B1
(45) Date of Patent: Nov. 22, 2016

(54) PATTERN CLASSIFICATION BASED PROXIMITY CORRECTIONS FOR RETICLE FABRICATION

(71) Applicant: GLOBALFOUNDRIES Singapore Pte. Ltd., Singapore (SG)

(72) Inventors: Guoxiang Ning, Ballston Lake, NY (US); Chin Teong Lim, Clifton Park, NY (US); Paul Ackmann, Gansevoort, NY (US); Christian Buergel, Langebrück (DE)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/734,033

(22) Filed: Jun. 9, 2015

(51) Int. Cl.
  *G06F 17/50* (2006.01)
  *G03F 1/36* (2012.01)

(52) U.S. Cl.
  CPC ............ *G03F 1/36* (2013.01); *G06F 17/5045* (2013.01)

(58) Field of Classification Search
  CPC ...................................... G03F 1/144
  USPC .......................................... 716/53
  See application file for complete search history.

(56) References Cited

U.S. PATENT DOCUMENTS

| 7,275,227 B1* | 9/2007 | Ying | G03F 1/36 716/52 |
| 8,464,194 B1* | 6/2013 | Agarwal | G03F 7/70433 716/112 |
| 8,938,697 B1* | 1/2015 | Zhao | G03F 1/36 716/53 |
| 2003/0115569 A1* | 6/2003 | Ikeuchi | G03F 1/144 716/52 |
| 2007/0266362 A1* | 11/2007 | Lai | G06F 17/5081 716/52 |
| 2008/0163140 A1* | 7/2008 | Fouquet | G03F 1/84 700/110 |
| 2014/0282288 A1* | 9/2014 | Dai | G06F 17/5009 716/51 |
| 2014/0358830 A1* | 12/2014 | Chiang | G06N 99/005 706/12 |
| 2015/0213374 A1* | 7/2015 | Agarwal | G06F 17/50 706/12 |

* cited by examiner

*Primary Examiner* — Suresh Memula
(74) *Attorney, Agent, or Firm* — Heslin Rothenberg Farley and Mesiti PC; Nicholas Mesiti

(57) ABSTRACT

Pattern classification based proximity corrections for reticle fabrication are provided. A digital layout of a circuit design and proximity compensation data generated based on measurements of formed reticle elements are obtained. The proximity compensation data includes proximity correction values to correct for proximity effects of a reticle-formation process to form a reticle for use in fabricating a circuit of the circuit design. Based on a pattern classification of one or more patterns in the digital layout of the circuit design, at least one proximity correction is applied to the digital layout of the circuit design to facilitate correcting for proximity effects of the reticle-formation process, the at least one proximity correction being determined based on one or more of the proximity correction values of the obtained proximity compensation data. Additional adjustments to the digital layout are also provided according to aspects described herein.

20 Claims, 12 Drawing Sheets

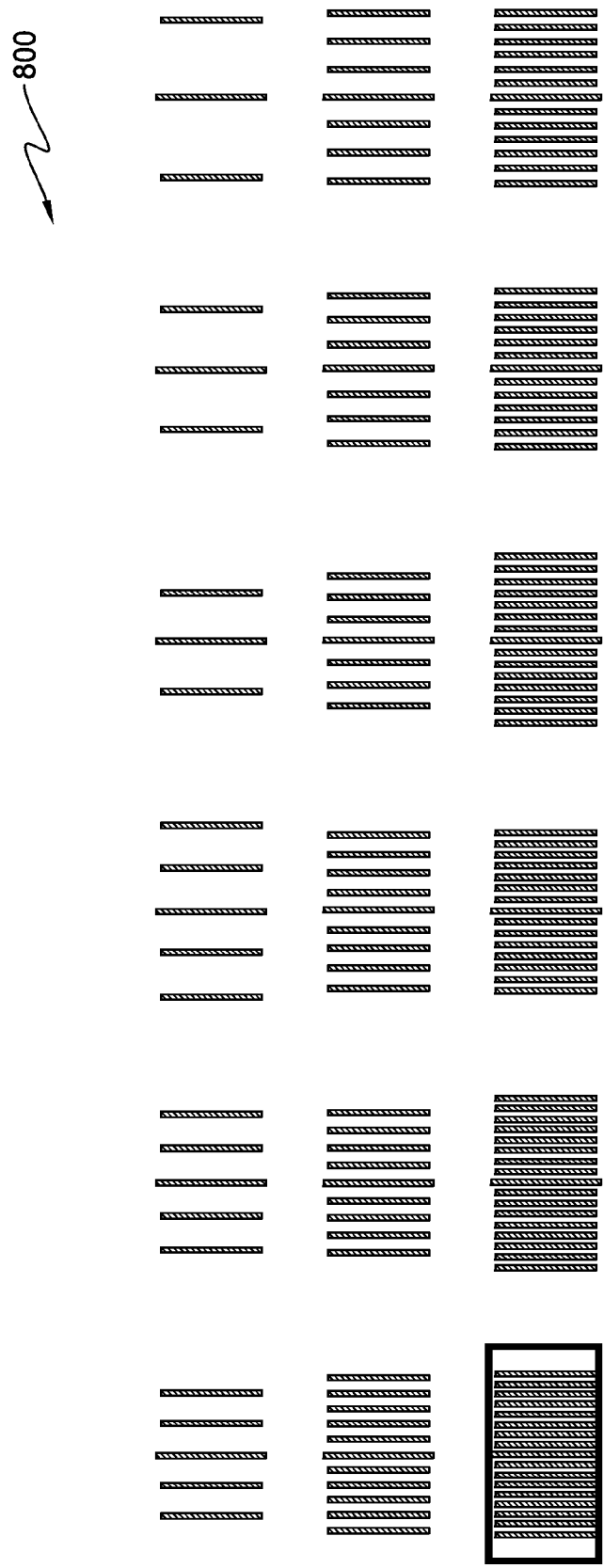

US 9,500,945 B1

PATTERN CLASSIFICATION BASED PROXIMITY CORRECTIONS FOR RETICLE FABRICATION

BACKGROUND

In circuit design, a typical process flow involves a design house producing a digital layout of the design then performing various modifications to the digital layout to bolster the physical and functional aspects of the circuit and adjust for deviations introduced during the fabrication process. Examples modifications include retargeting, dummy feature/via placement, and optical proximity correction (OPC), as examples. At some point, a milestone step known as "tape-out" is reached when the design is considered ready for a mask fabrication process. The design is sent to a mask house (which may or may not be part of the design house) and subjected to a mask data preparation process that itself might include modifications to the design, such as retargeting or bias adjustments, as examples. After that point, reticle(s) for use in printing the design are physically manufactured. A circuit manufacturer uses the reticle(s) to print the circuit design to create the physical circuit.

BRIEF SUMMARY

Variations between the printed circuit and the design may be due to the effects of the reticle process flow (that is, the processes of forming reticle(s), based on a circuit design, to properly expose a wafer to form the desired circuit). Conventional techniques for circuit design and reticle fabrication do not adequately provide for compensations to be made to a digital layout of a circuit design to account for these undesired variations.

Shortcomings of the prior art are overcome and additional advantages are provided through the provision of a method that includes: obtaining a digital layout of a circuit design; obtaining proximity compensation data generated based on measurements of formed reticle elements, the proximity compensation data including proximity correction values to correct for proximity effects of a reticle-formation process to form a reticle for use in fabricating a circuit of the circuit design; and applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

In a further aspect, a computer program product is provided that includes a computer readable storage medium storing program instructions readable by a processor for execution to perform a method including: a computer readable storage medium storing program instructions readable by a processor for execution to perform a method including: obtaining a digital layout of a circuit design; obtaining proximity compensation data generated based on measurements of formed reticle elements, the proximity compensation data including proximity correction values to correct for proximity effects of a reticle-formation process to form a reticle for use in fabricating a circuit of the circuit design; and applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

In yet a further aspect, a system is provided that includes a memory; and a processor in communication with the memory, wherein the system is configured to perform a method including: obtaining a digital layout of a circuit design; obtaining proximity compensation data generated based on measurements of formed reticle elements, the proximity compensation data including proximity correction values to correct for proximity effects of a reticle-formation process to form a reticle for use in fabricating a circuit of the circuit design; and applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

Additional features and advantages are realized through the concepts of the present invention. Other embodiments and aspects of the invention are described in detail herein and are considered a part of the claimed invention.

BRIEF DESCRIPTION OF THE DRAWINGS

Aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8 depicts example proximity test patterns to facilitate generating proximity compensation data, in accordance with aspects described herein;

DETAILED DESCRIPTION

Figure 1:
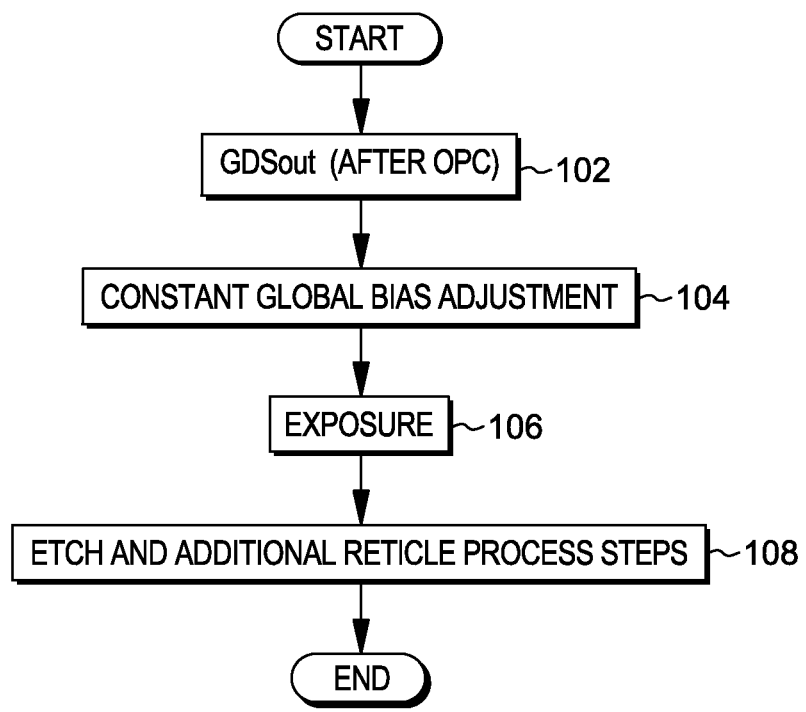
FIG. 1 depicts one example of a reticle process flow at a mask house.

As described above, a circuit design after tapeout exists in a digital layout that a mask house uses to manufacture reticle(s) (the term reticle as used herein is understood to encompass 'mask' and 'photomask' as understood in the art). An example of this manufacturing process, referred to herein as a reticle process, reticle process flow, or reticle-formation process, is depicted and described with reference to FIG. 1.

The process begins after a Graphic Data System output, GDSout (102) referring to the graphic database system output file/format of the digital layout for the subject circuit design. Various constant global bias adjustments are then determined/performed either separately, or, as depicted here, as part of a single process (104), to adjust for etch or other biases introduced during the reticle formation process. Example bias adjustments include coarse adjustments (ones that are generally applied indiscriminately to all features within a layout or portion thereof), and fine adjustments (ones that are more localized and separately applied to certain shapes or structures, as examples, and/or also applied to all features dependent on global densities of devices). Bias adjustments may be driven by layer-specific, device-specific, material-specific, or other considerations.

The process continues with exposure(s) (106) and subsequent etch(es) (108) and possibly additional steps, incorporating the above-mentioned bias adjustments, to form the reticle. Example reticle formation technologies applicable to aspects described herein include single or multiple electron-beam (ebeam) and laser mask "writers".

Different feature density on a mask produces different amounts of error, or deviation, between the mask features and the design. That is, that there are systematic errors exhibited in the features of a reticle dependent on the pitch of those features. Generally, larger pitches result in greater reticle feature measurements-to-target (MTTs) or measurements-to-nominal (MTNs) (i.e. with reference to the reticle features, as opposed to the features printed on a wafer using those masks), and relatively large MTTs/MTNs are undesirable. This problem is compounded on laser writers, where greater pitch can significantly degrade MTTs/MTNs. Conventional reticle writers do not incorporate proximity correction to account for small-range or even middle-range deviations. Existing proximity effect correction (PEC) is not granular, and is instead broad range oriented. Such broad range correction does not provide narrow range adjustments sufficient for today's shrinking technology.

Aspects described herein provide for pattern classification based proximity corrections/compensations for correcting proximity effects of the reticle-formation process. Patterns within a digital layout of the circuit design are classified and then, based on these classifications, proximity corrections that are built into a compensation data structure, such as a table, are identified and applied. The pattern classification classifies patterns exhibited in the digital layout of the circuit design. The proximity corrections built into the proximity compensation data indicate adjustments to be made to various portions of the design to ensure that the written reticle features are accurate to the design. They provide proximity correction for a reticle writer to ensure accuracy in sizing and positioning of elements of the reticle. Thus, aspects described herein use pattern classification to identify what portions of the layout should have adjustment(s) applied thereto, and supply compensation data that indicates what adjustments to apply given those classified patterns. Various approaches for pattern classification are possible. The classification can categorize the design features into various sub-classes based on specific layout configurations and criteria, geometry, density, one-dimensional vs. two-dimensional, line end, inverse pitch, island, post, pitch, width of line, or others. With more complexity in the pattern classification comes better accuracy but with the added cost of the additional runtime needed to complete the classification.

Generation of the reticle process compensation table(s) is described herein. It is possible to have multiple different sets of table(s) corresponding to different pattern classification approaches that might be taken. If testing has been done using two different pattern classification approaches (e.g. one-dimensional and two-dimensional) to generate proximity compensation data, then there will be compensation table(s) for proximity corrections for use when classifying using the one-dimensional approach, and table(s) for proximity corrections for use when classifying using the two-dimensional approach.

The proximity corrections can be incorporated into proximity correction flows, such as mask proximity correction (MPC) by a mask house and/or optical proximity correction (OPC) by a foundry/design house, as described in further detail below. Such proximity adjustments for reticle process flow correction address proximity effects introduced by the reticle fabrication equipment (e.g. "writer") and process itself. This is in contrast to proximity corrections that are done for other reasons, like accounting for effects of the wafer exposure process to expose a wafer using the reticle, as an example.

Figure 2:
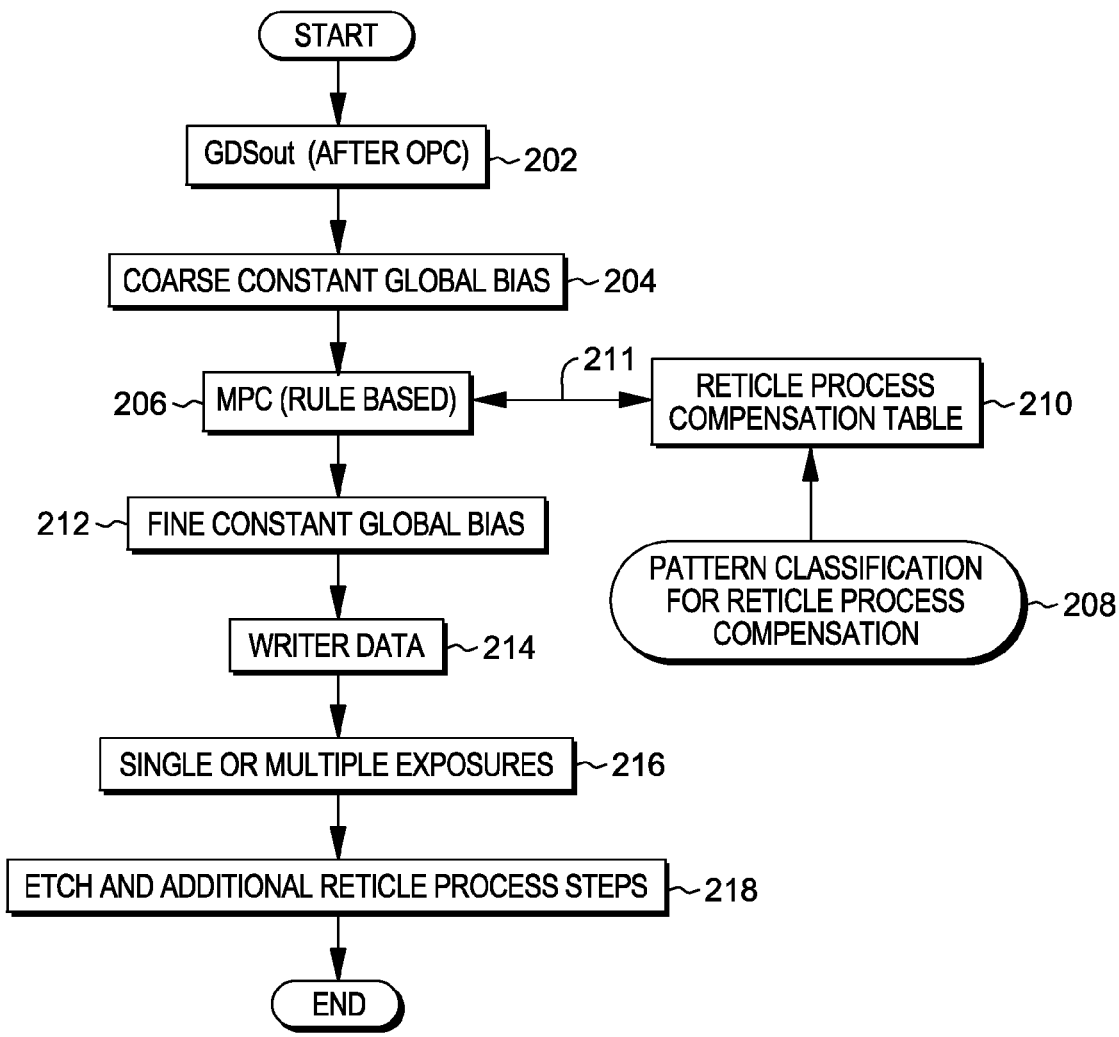
FIG. 2 depicts an example reticle process flow that incorporates proximity correction to facilitate correcting for proximity effects of the reticle-formation process, in accordance with aspects described herein.

FIG. 2 depicts an example reticle process flow that incorporates proximity correction to facilitate correcting for proximity effects of the reticle-formation process, in accordance with aspects described herein. The process begins as before by obtaining GDSout (202). Here, coarse constant global bias adjustment is applied (204) followed by rule-based (as opposed to model-based) mask proximity correction (MPC) (206). Proximity correction to facilitate correcting for proximity effects of the reticle-formation process as described herein is incorporated as part of the MPC (206). As one example, the rule-based MPC process crosstalks/handshakes (211) with pattern classification-based mask process proximity correction facilities identified by features 208 and 210. Pattern classification of pattern(s) in the digital layout of the circuit design are performed (208) for use in a reticle process compensation determination. Based on the pattern classification and on obtaining prior-generated proximity compensation data, pattern(s) exhibited in the digital layout of the circuit design are identified that correlate to one (or more) of the proximity test patterns used to generate the proximity compensation data. The proximity compensation data provides associations between the proximity test patterns and the corresponding proximity correction values that indicate proximity corrections to be applied to the same or similar patterns that are identified in circuit designs. Thus, a lookup in the compensation table is performed (210) to identify the proximity correction value(s) associated with the proximity test pattern(s) that are identified in the layout by the pattern classification. One or more of those proximity correction values are selected and used to determine actual proximity correction(s) to be applied to the digital layout of the circuit design to facilitate correcting for proximity effects of the reticle-formation process. As an example, a correction (numerical value(s)) and an indication of where the correction is to be made (e.g. patterns with coordinate(s)) are returned to the MPC process (206).

In some cases, the proximity corrections made to the digital layout are exactly as identified by the proximity correction value(s) from the compensation table. In other cases, it may be desirable to use those proximity correction value(s) as guidance to determine the actual proximity corrections to be applied. For instance, it might be beneficial to take into account other adjustments made to the layout as part of the reticle process flow, such as coarse/fine bias adjustments, when determining what proximity corrections to apply. This is a benefit of the crosstalking 211 between the MPC process (206) and the pattern classification-based mask process proximity correction facilities 208, 210. The proximity correction value(s) indicated in the compensation table, if applied to the layout in addition to the other adjustments being made, may result in a rule violation. By incorporating the pattern classification based proximity correction into the MPC flow (206), by way of the crosstalking, the process can avoid potential rule violations by using modified versions of the proximity correction value(s) indicated in the compensation table, modified versions of the bias adjustments being applied, or some combination of these.

The process of FIG. 2 continues with fine constant global bias adjustment (212) (which may optionally be combined into 204 as a single step, for instance for e-beam writers) after which writer data is produced (214), in which a data format conversion may be performed to put the digital layout into a format used by the reticle writer. In this regard, the writer might use a different format than that in which the GDSout data is delivered. Examples of standard GDSout data formats are *.GDS or *.OAS, and an example writer data format is *.VSB. After writer data is output (214), the process continues with exposure(s) (216) and subsequent etch(es) (218) (and possibly additional steps), and the process ends.

In the example of FIG. 2, the rule-based MPC process is performed between the coarse and fine bias adjustments (206 and 212 respectively), though in other examples these bias adjustments are combined into a single step and the MPC process is performed before or after these other adjustments. Alternatively, the MPC may be performed in conjunction with the bias adjustments as part of a single step, in which case the crosstalking of the pattern classification based proximity correction occurs in conjunction with the MPC/bias/other adjustment step of the process.

Figure 3:
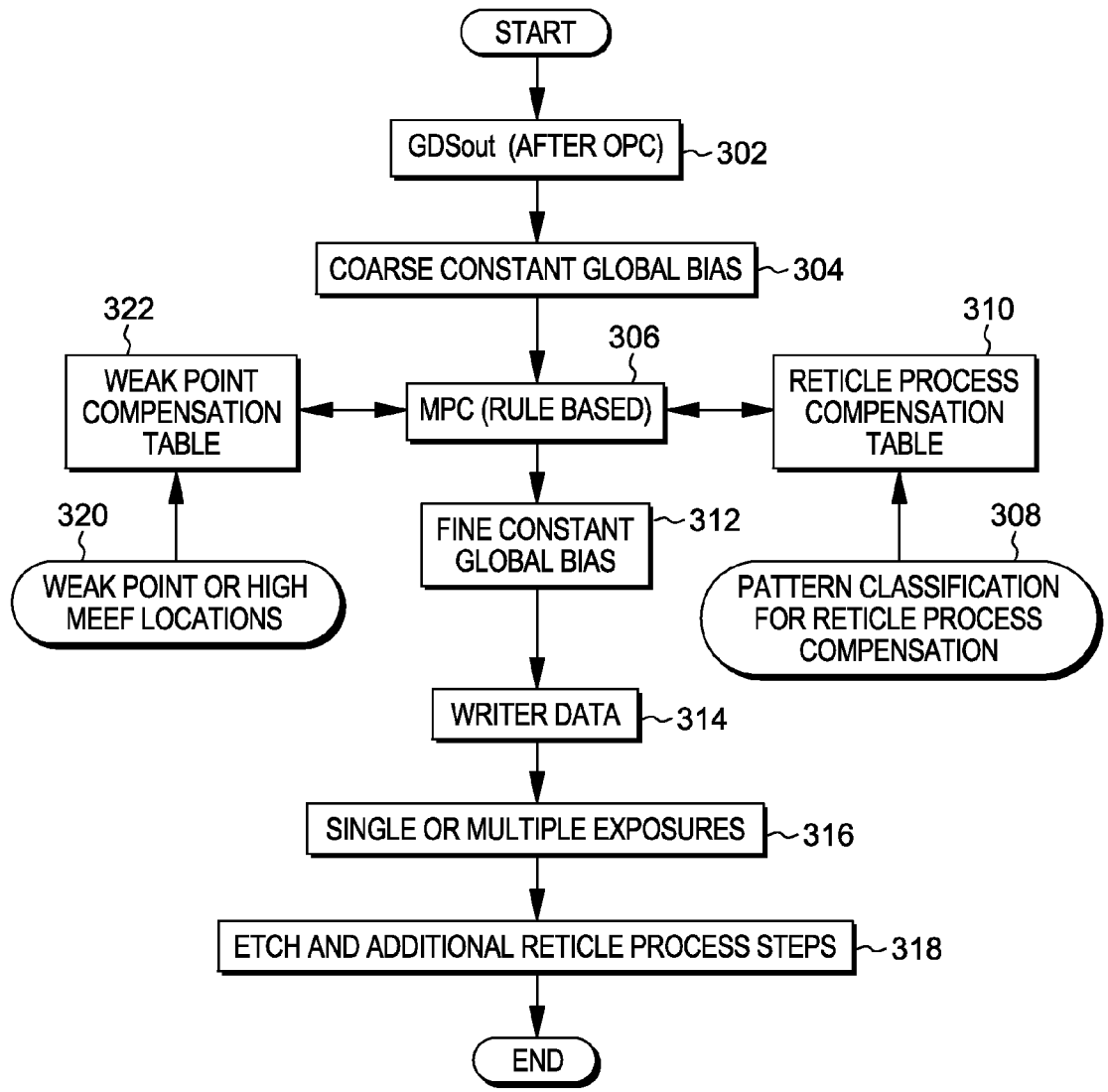
FIG. 3 depicts the example reticle process flow of FIG. 2 that additionally incorporates a critical area compensation process in accordance with aspects described herein.

In addition to incorporating pattern classification based proximity correction as described herein into the reticle process flow, a critical area compensation process may additionally/alternatively be incorporated into such a flow. FIG. 3 depicts the example reticle process flow of FIG. 2 that additionally incorporates such a critical area compensation process, in accordance with aspects described herein.

Critical areas refer to weak points/high-Mask Error Enhancement Factor (MEEF) points in the layout, which are points at which a deviation in the reticle from the digital specification becomes significantly and disproportionately amplified on the wafer when exposed using that reticle. This can cause various problems such as bridging or pinching. Conventionally, weak point/high-MEEF location adjustments are made on the design side during optical proximity correction, for instance. Such OPC correction attempts to address the problem by effecting changes to the circuit (what is finally printed). In accordance with aspects described herein, the problem is addressed after GDSout by instead targeting the changes to the fabrication of the reticle rather than the final printed product. The adjustments applied in the reticle process flow may in some cases be different than those that would have been applied on the design side to address the same problem.

The process of FIG. 3 initially mirrors that of FIG. 2, i.e. after GDSout (302), coarse bias adjustment (304) and rule-based MPC (306) are applied, with the MPC (306) incorporating pattern classification based proximity correction (308 and 310). In addition, MPC 306 can crosstalk with critical area compensation facilities 320 and 322. Specifically, weak point/high-MEEF locations are identified in the digital layout (320). This may be done using known techniques, usually involving gathering data after writing the designs to wafers and/or simulating the wafer print. A lookup is then performed in a weak point compensation table (322) to identify compensation(s) for applying to the digital layout to adjust for the weak points/high-MEEF areas. These compensation(s) are then applied to the digital layout of the circuit design based on identifying the critical areas and the compensation(s) to make. Noteworthy is that the identification of the critical areas and the applying the compensations are performed after the OPC and GDSout of the digital layout of the circuit design. Doing this isolates the weak point/high-MEEF compensations to correction for the reticle-formation process, rather than, e.g. a modification of the circuit design.

The crosstalking between the critical area compensation facilities (320 and 322) and MPC processing (306) enables the adjustments to be made in conjunction with other adjustments (such as the proximity corrections from 308 and 310 and bias adjustments), in order to prevent rule violation (such as those detected during a mask manufacturing rule check (MRC)) or other faults.

The process of FIG. 3 after MPC (306) (incorporating critical area compensation and pattern classification based proximity correction as described above) continues in the same manner as FIG. 2 after MPC (206), i.e. with fine constant global bias adjustment (312) (which in other examples can be combined into 304 as a single step, for instance for e-beam writers), writer data production (314), exposure(s) (316) and etch(es) 318. As before, MPC, bias, and/or other adjustments may be combined or rearranged in FIG. 3 as desired.

Figure 4:
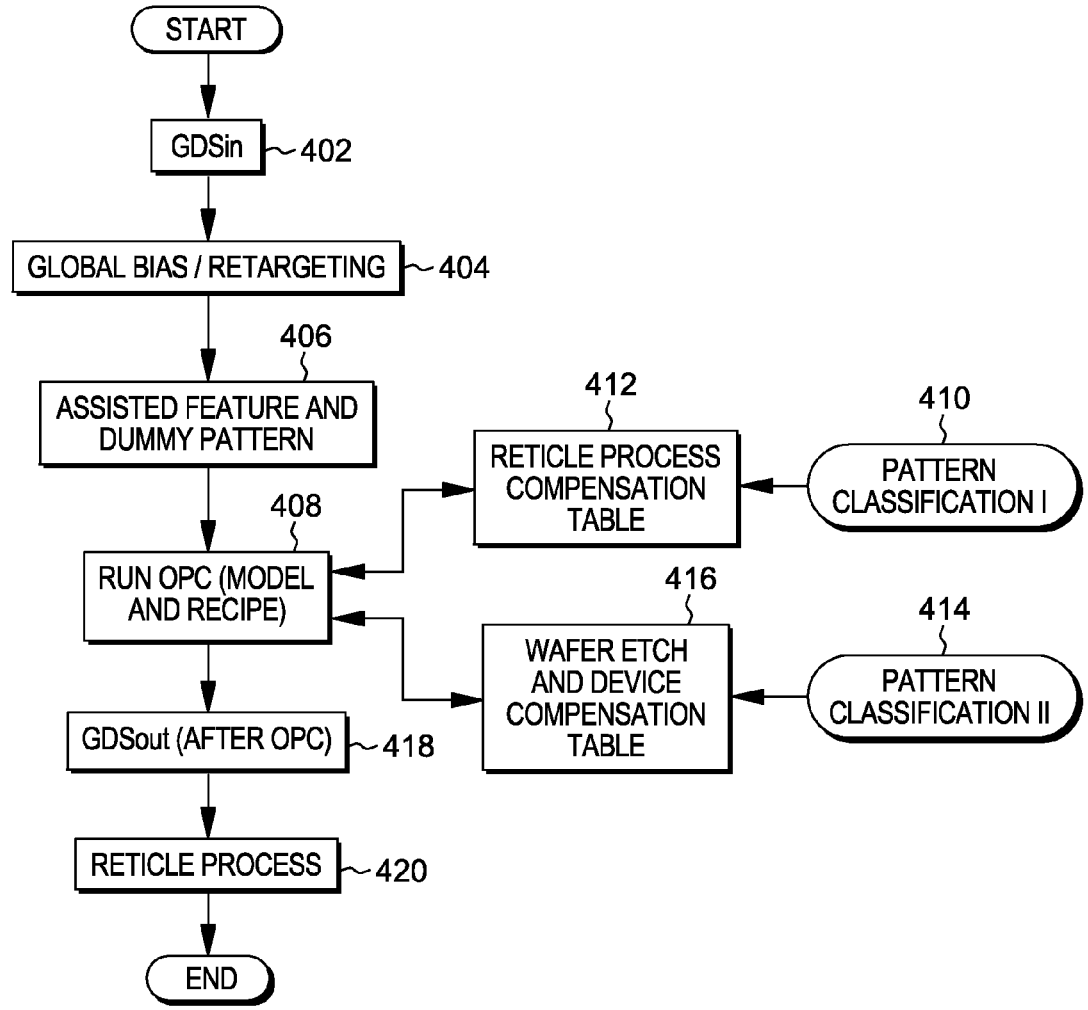
FIG. 4 depicts an example process of a design house, which process incorporates electrical property compensation and proximity correction to facilitate correcting for proximity effects of a reticle-formation process, in accordance with aspects described herein.
Figure 5:
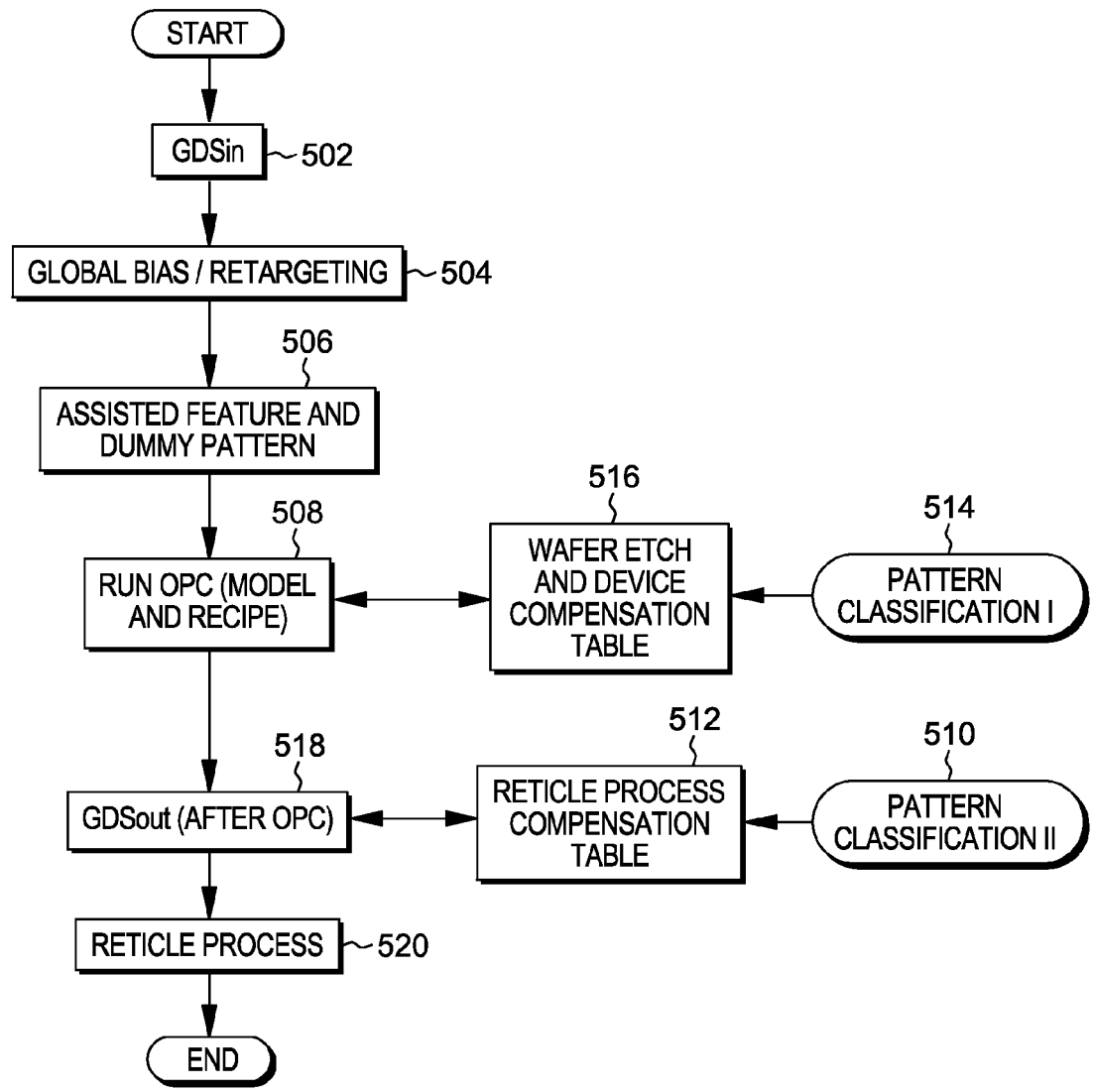
FIG. 5 depicts another example process of a design house, which process incorporates electrical property compensation and proximity correction to facilitate correcting for proximity effects of a reticle-formation process, in accordance with aspects described herein.

The examples of FIGS. 2 and 3 see the proximity correction for proximity effects of a reticle-formation process applied after tapeout. In other examples, corrections for these proximity effects can be applied prior to tapeout, for instance as part of OPC performed by a design house. As used herein, design house refers to entities that create, handle, modify, process, etc. a circuit design layout prior to tapeout, and therefore includes a traditional designer of the design, as well as a foundry that the designer uses in the production of the final design, i.e. to, for instance, perform adjustments to the design prior to GDSout. Thus, OPC or other activities performed on a design by a foundry or other shop on behalf of the designer of the design shall, as used herein, be considered activities of the design house. FIGS. 4 and 5 depict example processes of a design house, which processes incorporate the proximity correction to facilitate correcting for proximity effects of a reticle-formation process. A result is that the GDSout already incorporates the reticle process proximity corrections. In addition, the processes of FIGS. 4 and 5 also incorporate an electrical property compensation as described herein.

FIG. 4, the process incorporates the electrical property compensation and proximity correction for proximity effects of a reticle-formation process into the optical proximity correction performed by the foundry/design house. Referring to FIG. 4, the process begins with GDSin (402), representing the input of the initial digital layout of the circuit design. Global bias/retargeting similar to that described above is performed (404), as is assisted feature/dummy pattern insertion (406). The process then runs optical proximity correction (408), which in this example crosstalks with sub-processes for proximity correction to address proximity effects of a reticle-formation process and electrical property compensation, referred to as wafer etch and device compensation.

The sub-process for proximity correction to address proximity effects of a reticle-formation process is as described previously, in which a pattern classification is performed (410) and proximity correction(s) are applied using proximity correction values taken from a reticle process compensation table (412). To reiterate, the proximity correction being applied in these aspects, despite being applied on the design side, is to correct for proximity effects of a reticle-formation process by a mask house, rather than, for instance, proximity effects of printing a wafer using a reticle formed based on the design. The subprocess (410, 412) for proximity correction to address proximity effects of the reticle-formation process can generate a new layer map in the digital design to house the changes being made for the reticle process proximity correction. Housing those changes separate from the other layer maps of the design avoids the reticle process proximity corrections potentially negatively affecting/interacting with the flow of optical rule checking for OPC, simulation, and/or other aspects of processing the design.

The sub-process for electrical property compensation involves a second pattern classification (414), which may use the same approach or a different approach as pattern classification I (410). However this pattern classification II (414) and subsequent adjustments based thereon are to address effects of the wafer process, such as the wafer etch process, device performance, etc. Circuit designs are built with certain assumptions in mind regarding speed, power, current, or other electrical specifications. However, because manufacturing practices inevitably introduce deviations from the design, various adjustments may be identified (for instance printing a line at 17 nm width instead of the design-specified 14 nm) to ensure electrical specifications are met and to avoid so-called 'catastrophic' or 'critical' failures. Adjustments that are designed to prevent catastrophic failures are distinct from proximity corrections for optical effects, but may be performed in conjunction with an OPC process on the design side.

Accordingly, a wafer etch and device compensation table is provided that includes electrical property compensations to apply to various patterns exhibited in the circuit design in order to ensure acceptable electrical properties of the circuit. Based on the second pattern classification, compensations are applied to the layout using electrical property compensation values taken from the wafer etch and device compensation table (416). It is noteworthy that the adjustments applied for electrical property compensation may be different from the adjustments applied for reticle process compensation. For a given pattern, the process of FIG. 4 might identify an adjustment to account for the wafer etch process that might not be a necessary from a reticle process proximity correction adjustment standpoint, to accurately form the reticle, or vice versa. Alternatively, a given pattern may necessitate a first adjustment for the reticle process (to accurately form the reticle) and a second adjustment to account for the wafer etch process. In scenarios where the two adjustments are incompatible, one adjustment may be prioritized and/or some average or middle ground may be used as the adjustment to make. The process of FIG. 4 can account for both types of adjustments and coordinate them together with OPC adjustments to avoid rule violation or other faults.

Subsequent to model/rule-based OPC (408), the process continues by outputting the design (418) to a reticle process (420), such as that described with reference to FIG. 1, and the process ends.

FIG. 5 similarly incorporates on the design side electrical property compensation and proximity correction for proximity effects of a reticle-formation process. After GDSin (502), bias/retargeting (504) and assisted feature/dummy pattern insertion (506), OPC is run (508) incorporating the electrical property compensation adjustment described above (i.e as pattern classification 514 and wafer etch and device compensation table lookup 516). Once the OPC process has completed, the proximity correction for proximity effects of the reticle-formation process is performed by way of pattern classification (510) and reticle process compensation table lookup/application of proximity corrections (512). In this example, they are performed in conjunction with the GDS output (518) prior to provision of the layout for the reticle formation process (520). Moving the pattern classification and proximity correction for proximity effects of the reticle process to after the OPC process (508) serves to decomplicate the OPC process while still providing reticle process proximity correction for the design at the design house, so that such proximity corrections need not be performed by the mask house.

It is seen by FIGS. 4 and 5 that various aspects described herein may be performed by the design house. For instance, proximity compensation data can be obtained and proximity correction(s) can be applied to the digital layout concurrent with, or after, performing an optical proximity correction of the digital layout at the design house to correct for optical proximity effects of a wafer exposure using the reticle to fabricate the circuit. Whereas these proximity correction(s) to the digital layout of the circuit design provide reticle proximity correction for a reticle writer to ensure accuracy in sizing and positioning of elements of the reticle, the OPC corrects for the optical proximity effects of the wafer exposure to ensure accuracy in exposing the wafer using the reticle. The Graphic Data System output (GDSout) of the digital layout of the circuit design from the design house can therefore include the corrections for the optical proximity effects of the wafer exposure and the proximity correction(s) for the reticle writer.

In a specific example, a first pattern classification is performed for correcting for proximity effects of the reticle-formation process, in which proximity correction(s) made to the digital layout of the circuit design are performed by the foundry/design house concurrent with the OPC process for performing the OPC, and a second pattern classification is performed concurrent with the OPC process and the reticle formation proximity correction(s). The second pattern classification can identify additional correction(s) to apply to the digital layout of the circuit design to compensate for known problematic electrical properties associated with patterns in the digital layout of the circuit design.

Figure 6:
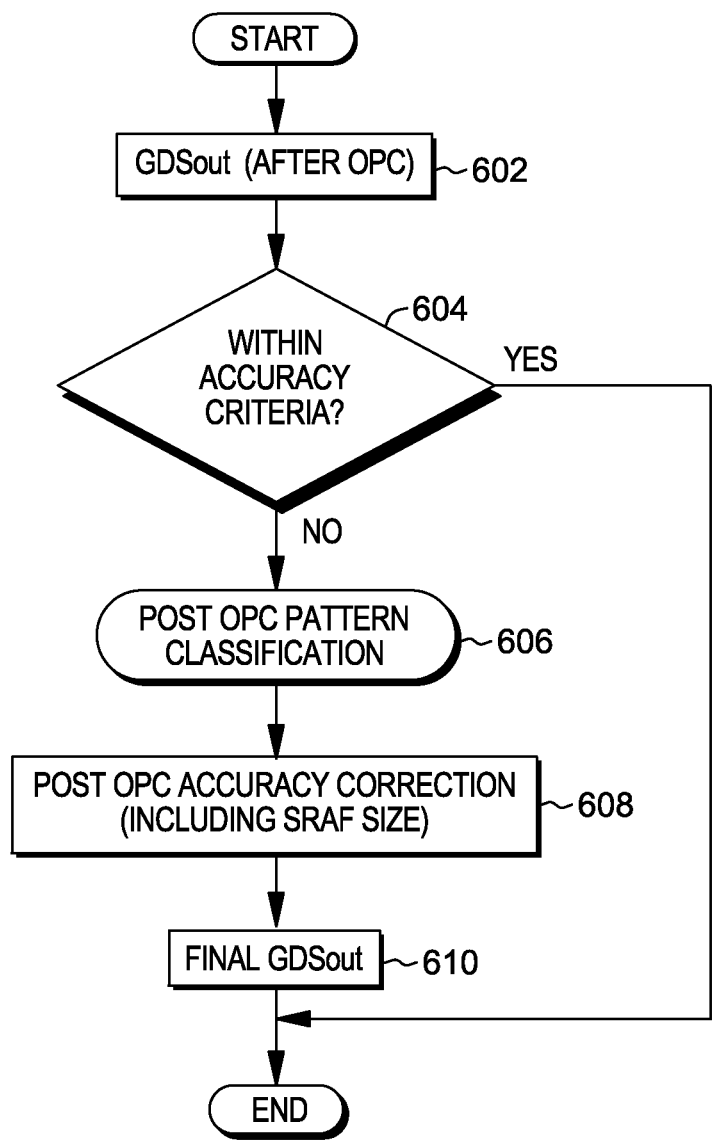
FIG. 6 depicts an example process for performing post-optical proximity correction model error correction, in accordance with aspects described herein.

According to additional aspects described herein, further accuracy corrections may be applied to the digital layout after OPC and GDSout, either by the foundry/design house (prior to the design reaching the mask house) or the mask house itself. These further corrections may address observable but uncorrected errors in the model(s) used for simulating the final wafer devices. Over time, as data are gathered after wafer production, discrepancies may be observed between the properties of the final wafer devices and the properties expressed in the simulations of those devices from the designs. This may be so even if the reticle is a perfect reflection of the layout of the circuit design. This so-called model error is represented as the difference between the wafer data (actual, real-world data of printed wafers) and simulation data (i.e. what the simulations produce using the model(s) in place). Further accuracy corrections may be made in accordance with aspects described herein, in which the design is examined and compared to how the wafer data suggests the design will actually be printed on a wafer. As a specific example, it may be determined that a particular 20 nm gap in a design is instead likely to print as 15 nm gap even after OPC and other adjustments, and contrary to what is indicated in the simulation data. Accordingly, post-OPC model error correction can be applied in accordance with aspects described herein, an example process of which is depicted in FIG. 6.

After GDSout (602), it is determined whether, based on current OPC being applied under a current OPC model, the design is within the accuracy criteria (604). In other words, it is determined whether the wafer data suggests that what will actually be produced on the wafer exceeds some accuracy criterion/criteria (such as +/−2 nm tolerance, as an example) based on wafer data for previously formed devices. If within the criteria, then the process ends (the initial GDSout is unchanged and is provided to a next entity). Otherwise the accuracy criteria is not met and the process proceeds by performing post-OPC pattern classification (606), which may be similar to the pattern classifications described above but focus on classifying patterns that are known to print different than the simulation model suggests. Based on identifying patterns that the wafer data suggests will print with deviations from the simulated version of the design, post-OPC accuracy correction is applied (608). As an example, one or more changes are made to the design, such as to sub-resolution assist features (SRAF) thereof. The changes are targeted to adjusting the design so that any deviations are brought to within the accuracy criterion/criteria. Example changes include enlarging features, moving edges, or increasing gap size, as examples.

It is noteworthy that the post-OPC accuracy correction may take place before the above-described proximity correction for reticle formation. The proximity correction for reticle formation ensures that the reticle is printed correctly for the given specification, i.e. that any prior-adjustments made to the design, including these post-OPC adjustments, are accurately reflected in the reticle. Furthermore, a difference between the post-OPC accuracy correction described above and the prior-described weak point/high-MEEF adjustments is that the weak point/high-MEEF adjustments target problems that are related to the lithographic process, i.e. the wafer etch, whereas the post-OPC accuracy correction addresses deficiencies in the simulation model. Even with no model error, weak point/high-MEEF areas may exist, and conversely elimination of weak point/high-MEEF areas does not eliminate model error.

Thus, in accordance with aspects of the post-OPC accuracy correction described herein, it is determined based at least in part on fabricated wafer data whether an accuracy criterion is met. If not, post-OPC pattern classification of the patterns in the digital layout is performed and post-OPC model error corrections are determined and applied to the digital layout of the circuit design. This can include, as an example, resizing sub-resolution assist features (SRAFs) in the digital layout.

Turning now to the generation of small-range proximity compensation data, the process includes writing various test patterns of varying sizes and/or other characteristics, such as density, on reticle(s) and taking measurements to inform of proximity correction values that should be applied to correct for the proximity effects of the reticle process. The patterns may be geared to reticle equipment proximity correction and/or optical proximity correction, and may be patterns for classifying any reticle features, including assist features.

Figure 7A:
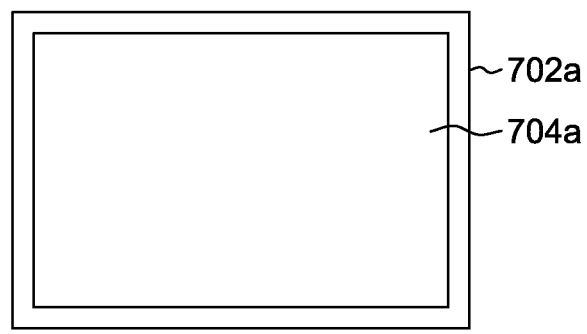
FIGS. 7A and 7B depict example ratio models for proximity test patterns to facilitate generating proximity compensation data, in accordance with aspects described herein.
Figure 7B:
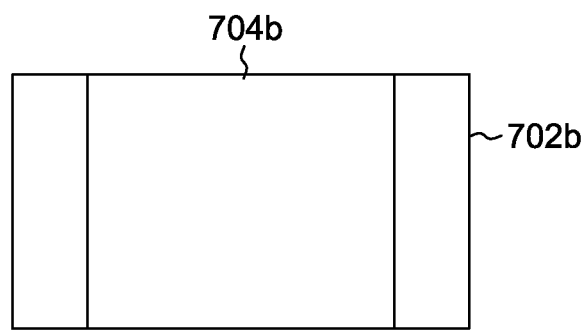

In particular examples, test pattern blocks are written for each of several ratios based on one or more ratio models. FIGS. 7A and 7B depict example ratio models for proximity test patterns to facilitate generating proximity compensation data, in accordance with aspects described herein. FIG. 7A illustrates a global area ratio model for a cell area in a design. 702a references the cell area bond and 704a references the pattern area. The global area ratio, $R_A$, is defined as the ratio of the pattern area to the cell area. A block of proximity test patterns (an example of which is depicted and described with reference to FIG. 8) at a given area ratio $R_A$ (such as 100%) can be formed on a reticle using the reticle writer for which the compensation is being generated. This process can be repeated using the same or a substantially similar block of proximity test patterns at several other $R_A$s (e.g. 90%, 80%, etc.) and/or several other cell areas. In specific examples, the cell areas across which tests can be performed can range from approximately 100 µm×100 µm to approximately 4 µm×4 µm at the 4× level.

The global area ratio model of FIG. 7A may be best suited for square cell areas. Alternatively, a global width ratio model, as depicted in FIG. 7B, may be best suited for rectangular cell areas. The global width ratio model considers width, rather than width and height, of the pattern area, as depicted in FIG. 7B. 702b again references the cell area bond and 704b references the pattern area. The global width ratio, $R_W$, is defined as the ratio of the pattern width to the cell width. As before, a block of proximity test patterns at a given width ratio $R_W$ (such as 100%) can be formed on a reticle using the reticle writer. This process can be repeated using the same or a substantially similar block of proximity test patterns but at several other $R_W$s (e.g. 90%, 80%, etc.) and/or several other cell areas.

FIG. 8 depicts example proximity test patterns to facilitate generating proximity compensation data, in accordance with aspects described herein. These test patterns may be part of a block (800) of test patterns at a given global area ratio and/or global width ratio as described above. In the example of FIG. 8, the cell area is rectangular and test patterns are of a fixed $R_W$. In some examples, if the cell area is square, for example 10 um by 10 um in the reticle level, the test patterns may be of a fixed $R_A$. In some examples, test cells of a block may be of a fixed width ratio and area ratio. In general, the patterns are of varying characteristics, which characteristics may include (but are not limited to): density, number of features, and/or sizing or orientation of features. As a specific example, the block includes test patterns that vary as to critical dimension through pitch (CDTP) and/or linearity. In the example of FIG. 8, the varying characteristics include varying densities (relatively dense to relatively isolated) and number of reticle features.

After the test features are produced on the reticle(s), measurements of those features are taken to inform whether deviations from the design exist, and, if so, to what extent. The deviations indicate proximity effects of the reticle-formation process. Proximity correction values to correct for such deficiencies are determined to produce the proximity compensation data, which can be built into tables or other data structures for portability and lookup based on the characteristics of pattern(s) that have been classified in a subject circuit design. Such tables can take on any desired form or complexity. For instance, a two-dimensional table might be built with the pattern characteristic 'density' along one dimension and cell-area or cell-width on another dimension. The proximity correction value associated with given density-area or density-width combination might be an average of the proximity corrections from the area-ratio and the width-ratio testing for that density and cell-area/cell-width combination. Additionally or alternatively, the proximity correction value associated with a given density-area or density-width combination may be an average proximity correction across all $R_A$s and $R_W$s tested, expressed as a function/factor of $R_A$ or $R_W$. As yet another example, a three dimensional table can be built with density on one dimension, $R_A$ or $R_W$ on another dimension, and cell-are or width-area on a third dimension. More generally, a n-dimensional table may be built with each of one or more pattern characteristics (density, cell-area, cell-width, pattern-area, pattern-width, $R_A$, $R_W$, etc.) being presented along a respective dimension.

In further embodiments, data points along a dimension can be expressed as ranges (for instance a range of densities and/or a range of cell-areas or cell-widths) with the proximity correction that is associated with a range being determined based on the proximity corrections corresponding to each data point within the range, such as an average thereof.

It is seen that granularity of the proximity compensation data tables can vary according to a desired complexity level. Higher complexity generally necessitates a greater number of tests to be performed and longer processing times during the pattern classification processes, but yields higher accuracy in the proximity corrections being applied.

The proximity compensation data is generated based on measurements of formed reticle elements, such as proximity test patterns that have been formed on reticle(s). The proximity test patterns may be of varying characteristics, where each proximity test pattern correlates to a respective pattern classification that may be exhibited in a layout of a circuit design. Varying characteristics include density, number of features, sizing or orientation of features, cell global area ratio, cell global width ratio, cell area, cell width, pattern area, and/or pattern width, as examples.

Aspects described herein advantageously provide for pattern classification based small and medium range proximity effect compensation for reticle writers to improve reticle proximity correction quality. Such reticle proximity correction may be incorporated into the reticle process of a mask house, or processes at a foundry/design house, such as existing optical proximity correction processes. It can provide more accurate reticle measurements-to-target (MTTs), thereby improving critical dimension uniformity (CDU) in the reticle and therefore the printed wafer. Further aspects described herein can improve OPC accuracy and improve weak point/high-MEEF process margins of printed wafers.

The foregoing aspects offer benefits applicable to various reticle writers (single, multiple beam) and mask writing technologies, including deep ultraviolet (DUV) and extreme ultraviolet (EUV). Thus, improvements are provided in the functioning of computer systems for creating, handling, and processing circuits designs, and for directing reticle writers to produce more accurate reticle features. Additionally, improvements in technologies and technical fields related to automated corrections applied to digital layouts of circuit designs for effects of reticle and wafer processes are also provided.

Figure 9:
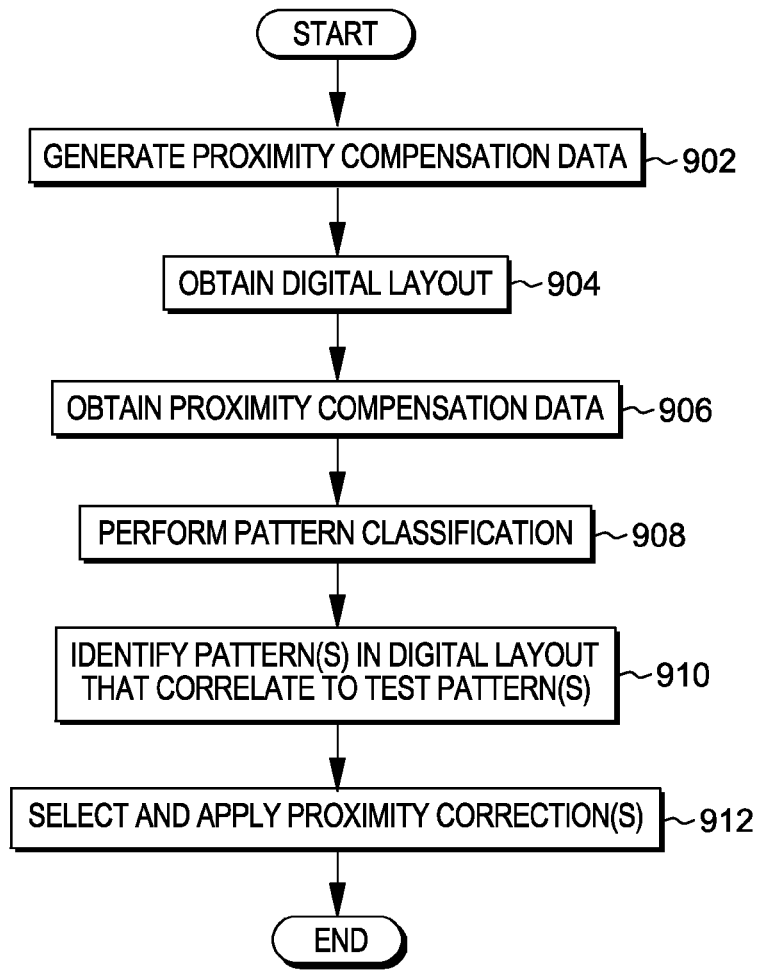
FIG. 9 depicts an example process to correct for proximity effects of a reticle-formation process, in accordance with aspects described herein.

According to aspects described herein, processes to correct for proximity effects of a reticle-formation process is provided, an example of which is described and depicted with reference to FIG. 9. The process begins by generating proximity compensation data (902). The proximity compensation data may be generated based on measurements of formed reticle elements, which include a plurality of proximity test patterns that have been formed on at least one reticle. The proximity compensation data includes proximity correction values to correct for proximity effects of a reticle-formation process to form a reticle for use in fabricating a circuit of the circuit design. Specifically, generating the proximity compensation data can include, for instance, forming a plurality of proximity test patterns on one or more reticles, the plurality of proximity test patterns being of varying characteristics, wherein each proximity test pattern of the plurality of proximity test patterns correlates to a respective pattern classification that may be later identified in a layout of a circuit design. Example such varying characteristics include one or more of density, number of features, sizing or orientation of features, cell global area ratio, cell global width ratio, cell area, cell width, pattern area, or pattern width. Measurements of the test patterns written on a reticle may be made to identify associated proximity correction values to correct for deviations exhibited in those written test patterns from the design.

FIG. 9 proceeds by obtaining a digital layout of a circuit design (904) and obtaining the proximity compensation data (906). The digital layout of the circuit design may exhibit various patterns that may be classified. Accordingly, a pattern classification is performed against the circuit design (908), where the pattern classification classifies patterns exhibited in the digital layout of the circuit design. Then, based on the pattern classification, pattern(s) exhibited in the digital layout of the circuit design are identified and correlated to one (or more) of the proximity test patterns on which the generation of the proximity compensation data was based (910). Proximity corrections are then selected and applied (912), in one example by a processor of system(s) performing aspects of FIG. 9. The proximity corrections are selected based on the proximity correction values that are associated with the test patterns that correlate to the observed/classified patterns exhibited in digital layout of the circuit design. The proximity correction(s) actually applied may match the proximity correction values in the proximity compensation data, or may be derived from those values, for instance an average, or adjusted version of those values depending on the circumstances. The proximity correction(s) are applied to the digital layout of the circuit design, which facilitates correcting for proximity effects of the reticle-formation process. Specifically, applying the proximity correction(s) applies the proximity correction(s) to the digital specification of the pattern(s) exhibited in the digital layout of the circuit design.

Some or all of the process of FIG. 9 may be performed by a mask house (i.e. system(s) thereof), for instance in cooperation with a reticle proximity correction flow or a global bias adjustment process of the mask house. Alternatively, some or all of the process of FIG. 9 may be performed by a foundry/design house (i.e. system(s) thereof) concurrent with, or after, performing an Optical Proximity Correction (OPC) of the digital layout of the circuit design. For instance, one or more computer systems of a foundry/design house may perform the obtaining the digital layout of the circuit design, obtaining the proximity compensation data, and applying the proximity correction(s) to the digital layout of the circuit design. The one or more systems may perform an OPC process to apply corrections for optical proximity effects of a wafer exposure using the reticle to fabricate the circuit, where the proximity correction(s) to the digital layout of the circuit design provide reticle proximity correction for a reticle writer to ensure accuracy in sizing and positioning of elements of the reticle, and the OPC corrects for the optical proximity effects of the wafer exposure to ensure accuracy in exposing the wafer using the reticle. Based on a foundry/design house applying the proximity correction(s) to the digital layout and performing the OPC, a Graphic Data System output (GDSout) of the digital layout of the circuit design from the foundry/design house includes the corrections for the optical proximity effects of the wafer exposure and further includes the proximity correction(s) for the reticle writer in the reticle-formation process.

Figure 10:
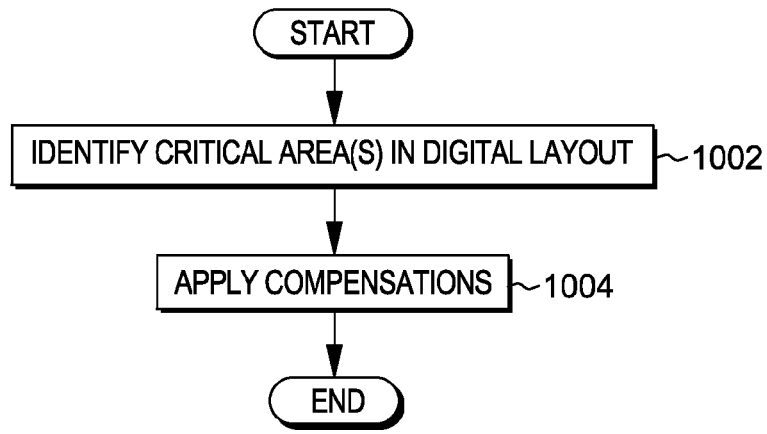
FIG. 10 depicts an example process to apply critical area compensation, in accordance with aspects described herein.

According to further aspects described herein, processes to apply critical area compensation are provided, an example of which is described and depicted with reference to FIG. 10. The process may be performed in conjunction with, or independent from, the process of FIG. 9. The process includes identifying critical areas in the digital layout of the circuit design (1002) and applying compensation(s) to the digital layout of the circuit design based on identifying the critical areas (1004). The critical areas can includes weak point location(s) or high Mask Error Enhancement Function (MEEF) location(s), as examples, and the compensation(s) may be indicated in a compensation table including compensations for known weak point locations or high-MEEF locations to apply to reticle data.

Some or all of the process of FIG. 10 may be performed by one or more systems of the mask house. In some examples, the identifying the critical areas and the applying the compensation(s) are performed subsequent to an Optical Proximity Correction (OPC) of the digital layout of the circuit design and a Graphic Data System output (GDSout) of the digital layout of the circuit design, in order to isolate the compensation(s) to correction for the reticle-formation process rather than a modification of the design of the circuit itself.

Figure 11:
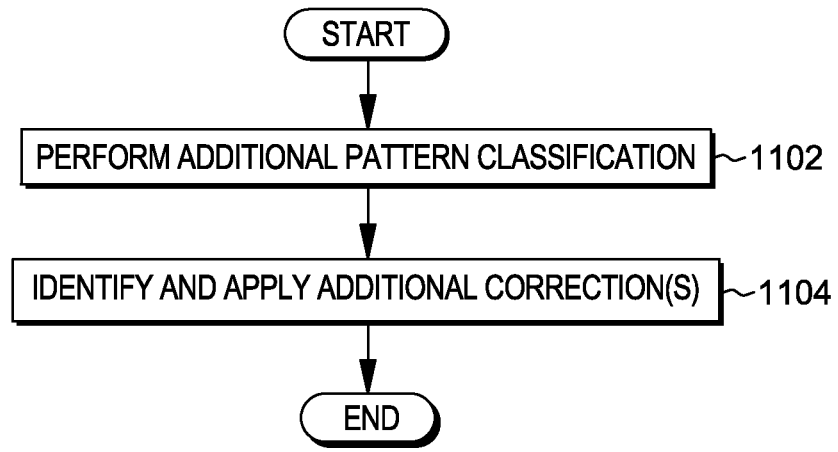
FIG. 11 depicts an example process to compensate for known problematic electrical properties associated with patterns in a digital layout of a circuit design, in accordance with aspects described herein.

According to additional aspects described herein, processes to compensate for known problematic electrical properties associated with patterns in a digital layout of a circuit design are provided, an example of which is described and depicted with reference to FIG. 11. In some examples, the process of FIG. 11 is performed by one or more computer systems of a foundry/design house that also performs aspects of FIG. 9 described above. For instance, the pattern classification (FIG. 9, 908) may be a first pattern classification for correcting for proximity effects of the reticle-formation process, where applying the proximity correction (s) to the digital layout of the circuit design is performed by the foundry/design house concurrent with an OPC process for performing OPC on the design. Referring to FIG. 11, the process to compensate for known problematic electrical properties associated with patterns in a digital layout includes performing an additional pattern classification (1102) of the pattern(s) in the digital layout of the circuit design to identify additional correction(s) to apply (1104) to the digital layout of the circuit design to compensate for known problematic electrical properties associated with patterns of the one or more patterns in the digital layout of the circuit design. In some examples, this is performed concurrent with the OPC process and the applying the at least one proximity correction for proximity effects of the reticle-formation process.

Figure 12:
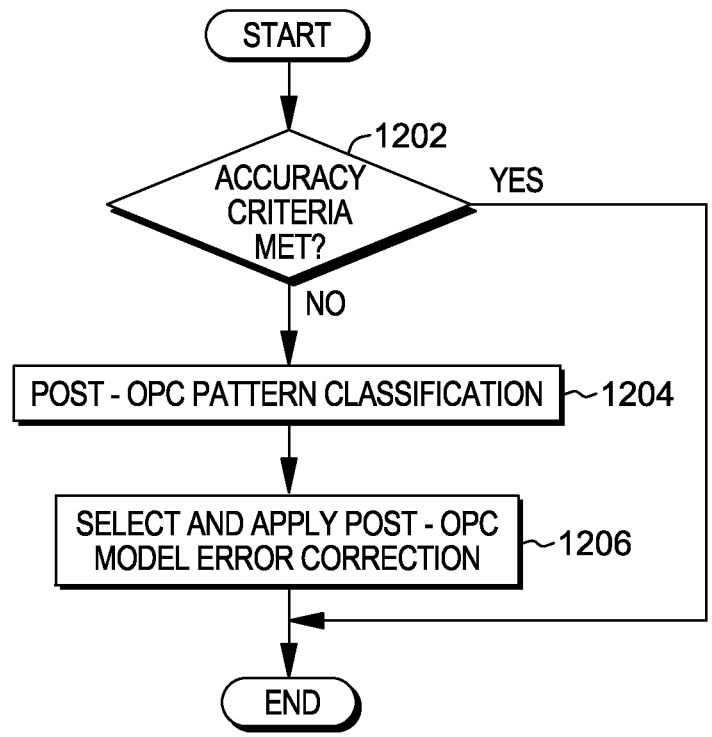
FIG. 12 depicts another example process for performing post-optical proximity correction model error correction, in accordance with aspects described herein.

According to yet further aspects described herein, processes for performing post-optical proximity correction (OPC) model error correction are provided, an example of which is described and depicted with reference to FIG. 12. The process may be invoked subsequent to an Optical Proximity Correction (OPC) of the digital layout of the circuit design and a Graphic Data System output (GDSout) of the digital layout of the circuit design from the foundry/ design house, in order to apply post-OPC model error correction(s) to the digital layout of the circuit design. The process begins by determining, based at least in part on fabricated wafer data, whether accuracy criteria is met (1202). If so (meaning within the accuracy criterion/criteria), then the process ends. Otherwise, based on determining that the accuracy criteria is not met, a post-OPC pattern classification of the pattern(s) in the digital layout of the circuit design is performed (1204). Based on that classification and on the fabricated wafer data, post-OPC model error correction(s) are determined, which are selected and applied (1206) to the digital layout of the circuit design. An example of a post-OPC model error correction includes resizing of sub-resolution assist features (SRAF) in the digital layout of the circuit design.

Those having ordinary skill in the art will recognize that aspects of the present invention may be embodied in system (s), method(s) and/or computer program product(s). In some embodiments, aspects of the present invention may be embodied entirely in hardware, entirely in software (for instance in firmware, resident software, micro-code, etc.), or in a combination of software and hardware aspects that may all generally be referred to herein as a "system" and include circuit(s) and/or module(s).

Figure 13:
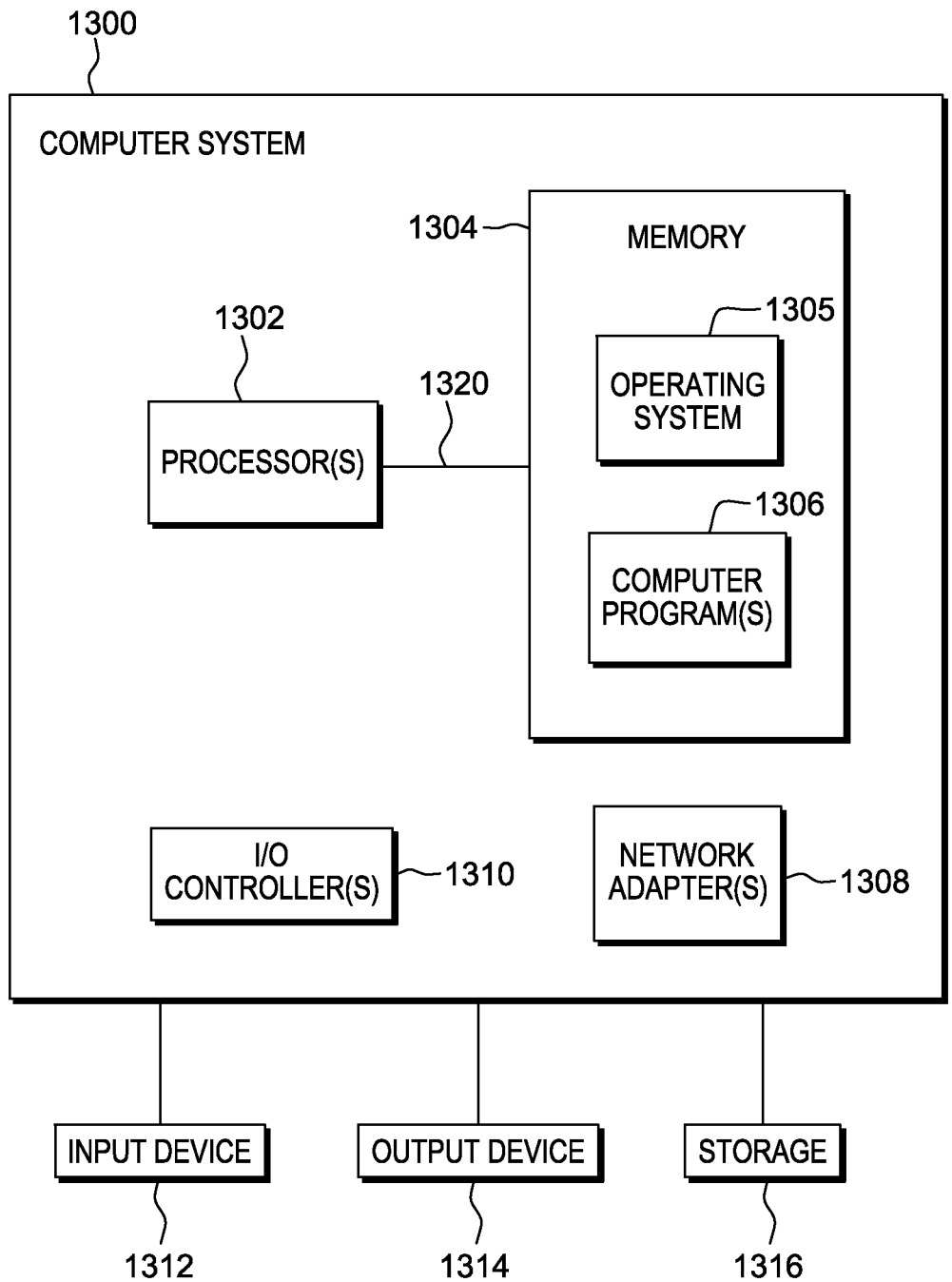
FIG. 13 depicts an example computer system to incorporate and use aspects described herein.

FIG. 13 depicts one example of a computer system to incorporate and use one or more aspects of the present invention. Computer system 1300 may be a computer system of a foundry/design house and/or a mask house, such as a computer system used to build a digital layout of a circuit design, and/or a computer system for producing data used by a reticle fabrication device (e.g. a writer) to fabricate a reticle. Computer system 1300 of FIG. 13 is suitable for storing and/or executing program code, such as program code for performing processes described above and includes at least one processor 1302 coupled directly or indirectly to memory 1304 through, a bus 1320. In operation, processor (s) 1302 obtain from memory 1304 instructions for execution by the processor(s). Memory 1304 may include local memory employed during actual execution of the program code, bulk storage, and cache memories which provide temporary storage of at least some program code in order to reduce the number of times code must be retrieved from bulk storage during program code execution. A non-limiting list of examples of memory 1304 includes a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 1304 includes an operating system 1305 and one or more computer programs 1306, such as one or more programs for execution to perform aspects described herein, such as effecting adjustments to a digital layout of a circuit design.

Input/Output (I/O) devices 1312, 1314 (such as peripheral devices) may be coupled to the system either directly or through I/O controllers 1310. Network adapters 1308 may also be coupled to the system to enable the computer system to become coupled to other computer systems through intervening private or public networks. Modems, cable modem and Ethernet cards are just a few of the currently available types of network adapters 1308. In one example, network adapters 1308 facilitate obtaining data from remote sources to facilitate aspects of the present invention.

Computer system 1300 may be coupled to storage 1316 (e.g., a non-volatile storage area, such as magnetic disk drives, optical disk drives, a tape drive, etc.), having one or more databases. Storage 1316 may include an internal storage device or an attached or network accessible storage. Computer programs in storage 1316 may be loaded into memory 1304 and executed by a processor 1302.

The computer system 1300 may include fewer components than illustrated, additional components not illustrated herein, or some combination of the components illustrated and additional components. Computer system 1300 may include any computing device, such as a mainframe, server, personal computer, workstation, laptop, handheld computer, smartphone, table, or other mobile device, telephony device, network appliance, virtualization device, storage controller, etc.

In addition, processes described above may be performed by multiple computer systems 1300, working in concert as part of a computing environment.

In some embodiments, aspects of the present invention may take the form of a computer program product embodied in computer readable medium(s). The computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 14:
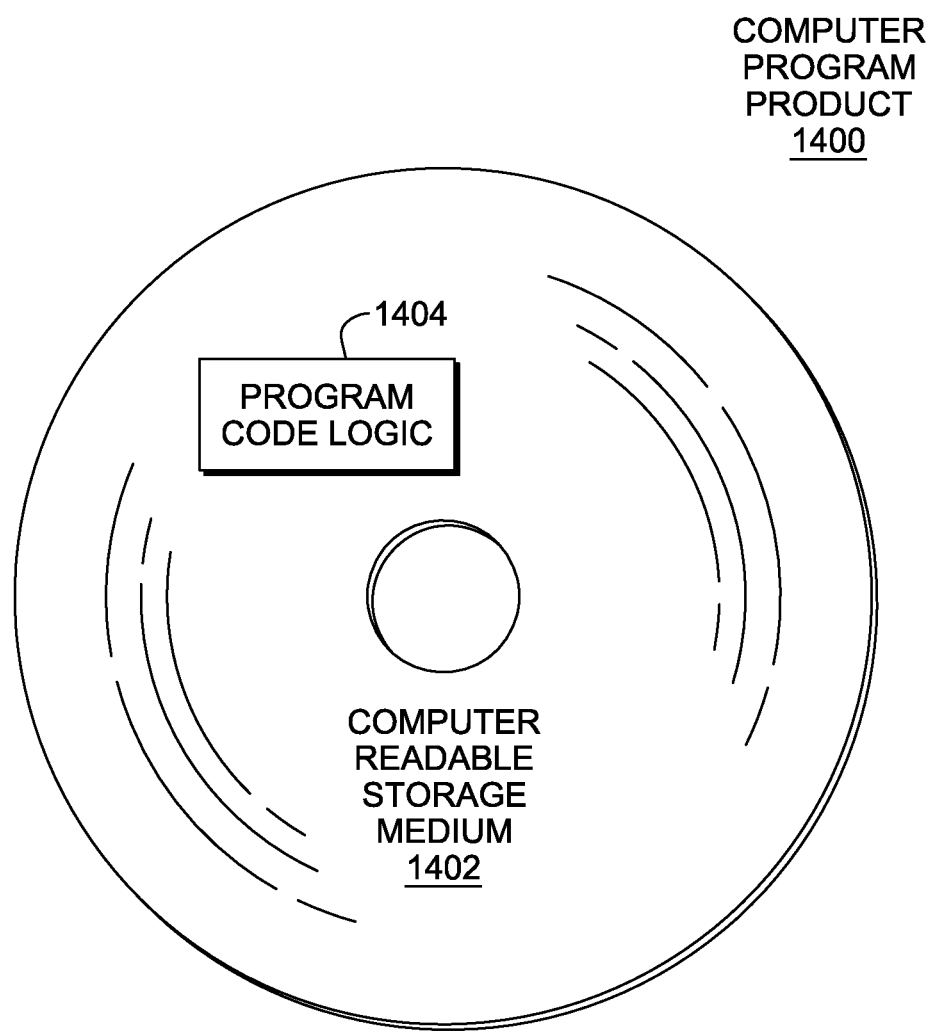
FIG. 14 depicts an embodiment of a computer program product incorporating aspects described herein.

Referring now to FIG. 14, in one example, a computer program product 1400 includes, for instance, one or more computer readable media 1402 to store computer readable program code means or logic 1404 thereon to provide and facilitate one or more aspects of the present invention.

Program code contained or stored in/on a computer readable medium can be obtained and executed by a computer system (computer, computer system, etc. including a component thereof) and/or other devices to cause the computer system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present invention may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more computer system, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects of the present invention. These flowchart illustrations and/or block diagrams could, therefore, be of methods, apparatuses (systems), and/or computer program products according to aspects of the present invention.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining a digital layout of a circuit design;
    obtaining proximity compensation data generated based on measurements of formed reticle elements, the proximity compensation data comprising proximity correction values to correct for proximity effects of a reticle-formation process to form a reticle for use in fabricating a circuit of the circuit design; and
    applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

2. The method of claim 1, wherein the formed reticle elements comprise a plurality of proximity test patterns that have been formed on at least one reticle, wherein the one or more proximity correction values on which the at least one proximity correction is based are associated with, and generated based on measurement of, at least one proximity test pattern of the plurality of proximity test patterns, and wherein the method further comprises:
    identifying, based on the pattern classification, at least one pattern exhibited in the digital layout of the circuit design that correlates to the at least one proximity test pattern; and
    based on the one or more proximity correction values being associated with the at least one proximity test pattern, selecting the one or more proximity correction values as those on which the at least one proximity correction is to be determined.

3. The method of claim 2, wherein applying the at least one proximity correction applies the at least one proximity correction to the at least one pattern exhibited in the digital layout of the circuit design.

4. The method of claim 2, further comprising performing the pattern classification, wherein the pattern classification classifies the at least one pattern exhibited in the digital layout of the circuit design.

5. The method of claim 1, wherein obtaining the digital layout of the circuit design, obtaining the proximity compensation data, and applying the at least one proximity correction to the digital layout of the circuit design are performed by one or more systems of a mask house for manufacturing the reticle.

6. The method of claim 5, wherein obtaining the digital layout of the circuit design, obtaining the proximity compensation data, and applying the at least one proximity correction to the digital layout of the circuit design are performed in cooperation with a reticle proximity correction flow or a global bias adjustment process of the mask house.

7. The method of claim 5, further comprising performing, by the one or more systems of the mask house, a critical area compensation process comprising:
    identifying critical areas in the digital layout of the circuit design; and
    applying one or more compensations to the digital layout of the circuit design based on identifying the critical areas, wherein the identifying the critical areas and the applying the one or more compensations are performed subsequent to an Optical Proximity Correction (OPC) of the digital layout of the circuit design and a Graphic Data System output (GDSout) of the digital layout of the circuit design, in order to isolate the one or more compensations to correction for the reticle-formation process rather than a modification of the circuit design.

8. The method of claim 7, wherein the critical areas comprise one or more weak point locations or high Mask Error Enhancement Function (MEEF) locations, and wherein the one or more compensations are indicated in a compensation table comprising compensations for known weak point locations or high-MEEF locations to apply to reticle data.

9. The method of claim 1, wherein obtaining the digital layout of the circuit design, obtaining the proximity compensation data, and applying the at least one proximity correction to the digital layout of the circuit design are performed by one or more systems of a design house of the digital layout of the circuit design concurrent with, or after, performing an Optical Proximity Correction (OPC) of the digital layout of the circuit design, the OPC applying corrections for optical proximity effects of a wafer exposure using the reticle to fabricate the circuit, the at least one proximity correction to the digital layout of the circuit design providing reticle proximity correction for a reticle writer to ensure accuracy in sizing and positioning of elements of the reticle, and the OPC correcting for the optical proximity effects of the wafer exposure to ensure accuracy in exposing the wafer using the reticle, wherein, based on applying the at least one proximity correction to the digital layout and on performing the OPC, a Graphic Data System output (GDSout) of the digital layout of the circuit design from the design house comprises the corrections for the optical proximity effects of the wafer exposure and further comprises the at least one proximity correction for the reticle writer.

10. The method of claim 9, wherein the pattern classification comprises a first pattern classification for correcting for proximity effects of the reticle-formation process, wherein applying the at least one proximity correction to the digital layout of the circuit design is performed by the design house concurrent with an OPC process for performing the OPC, and wherein the method further comprises performing, concurrent with the OPC process and the applying the at least one proximity correction to the digital layout of the circuit design, a second pattern classification of the one or more patterns in the digital layout of the circuit design to identify at least one additional correction to apply to the digital layout of the circuit design to compensate for known problematic electrical properties associated with patterns of the one or more patterns in the digital layout of the circuit design.

11. The method of claim 1, further comprising, subsequent to an Optical Proximity Correction (OPC) of the digital layout of the circuit design and to a Graphic Data System output (GDSout) of the digital layout of the circuit design from the design house, applying at least one post-OPC model error correction to the digital layout of the circuit design, the applying the at least one post-OPC model error correction comprising:
  determining, based at least in part on fabricated wafer data, whether an accuracy criterion is met; and
  based on determining that the accuracy criterion is not met:
    performing a post-OPC pattern classification of the one or more patterns in the digital layout of the circuit design;
    determining the at least one post-OPC model error correction to apply, the at least one post-OPC model error correction to apply determined based on the fabricated wafer data and the post-OPC pattern classification; and
    applying the at least one post-OPC model error correction to the digital layout of the circuit design.

12. The method of claim 11, wherein the at least one post-OPC model error correction comprises a resizing of one or more sub-resolution assist features in the digital layout of the circuit design.

13. The method of claim 1, further comprising generating the proximity compensation data, the generating the proximity compensation data comprising forming a plurality of proximity test patterns on one or more reticles, the plurality of proximity test patterns being of varying characteristics, wherein each proximity test pattern of the plurality of proximity test patterns correlates to a respective pattern classification.

14. The method of claim 13, wherein the varying characteristics comprises at least one of a group comprising: density, number of features, sizing or orientation of features, cell global area ratio, cell global width ratio, cell area, cell width, pattern area, or pattern width.

15. A computer program product comprising:
  a non-transitory computer readable storage medium storing program instructions readable by a processor for execution to perform a method comprising:
    obtaining a digital layout of a circuit design;
    obtaining proximity compensation data generated based on measurements of formed reticle elements, the proximity compensation data comprising proximity correction values to correct for proximity effects of a reticle-formation process to form a reticle for use in fabricating a circuit of the circuit design; and
    applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

16. The computer program product of claim 15, wherein obtaining the digital layout of the circuit design, obtaining the proximity compensation data, and applying the at least one proximity correction to the digital layout of the circuit design are performed by one or more systems of a mask house for manufacturing the reticle, and wherein the method further comprises performing, by the one or more systems of the mask house, a critical area compensation process comprising:
  identifying critical areas in the digital layout of the circuit design; and
  applying one or more compensations to the digital layout of the circuit design based on identifying the critical areas, wherein the identifying the critical areas and the applying the one or more compensations are performed subsequent to an Optical Proximity Correction (OPC) of the digital layout of the circuit design and a Graphic Data System output (GDSout) of the digital layout of the circuit design, in order to isolate the one or more compensations to correction for the reticle-formation process rather than a modification of the circuit design.

17. The computer program product of claim 15, wherein obtaining the digital layout of the circuit design, obtaining the proximity compensation data, and applying the at least one proximity correction to the digital layout of the circuit design are performed by one or more systems of a design house of the digital layout of the circuit design concurrent with, or after, performing an Optical Proximity Correction (OPC) of the digital layout of the circuit design, the OPC applying corrections for optical proximity effects of a wafer exposure using the reticle to fabricate the circuit, the at least one proximity correction to the digital layout of the circuit design providing reticle proximity correction for a reticle writer to ensure accuracy in sizing and positioning of elements of the reticle, and the OPC correcting for the optical proximity effects of the wafer exposure to ensure accuracy in exposing the wafer using the reticle, wherein, based on applying the at least one proximity correction to the digital layout and on performing the OPC, a Graphic Data System output (GDSout) of the digital layout of the circuit design from the design house comprises the corrections for the optical proximity effects of the wafer exposure and further comprises the at least one proximity correction for the reticle writer, and wherein the pattern classification comprises a first pattern classification for correcting for proximity effects of the reticle-formation process, wherein applying the at least one proximity correction to the digital layout of the circuit design is performed by the design house concurrent with an OPC process for performing the OPC, and wherein the method further comprises performing, concurrent with the OPC process and the applying the at least one proximity correction to the digital layout of the circuit design, a second pattern classification of the one or more patterns in the digital layout of the circuit design to identify at least one additional correction to apply to the digital layout of the circuit design to compensate for known problematic electrical properties associated with patterns of the one or more patterns in the digital layout of the circuit design.

18. The computer program product of claim 15, wherein the method further comprises, subsequent to an Optical Proximity Correction (OPC) of the digital layout of the circuit design and to a Graphic Data System output (GDSout) of the digital layout of the circuit design from the design house, applying at least one post-OPC model error correction to the digital layout of the circuit design, the applying the at least one post-OPC model error correction comprising:

determining, based at least in part on fabricated wafer data, whether an accuracy criterion is met; and based on determining that the accuracy criterion is not met:

performing a post-OPC pattern classification of the one or more patterns in the digital layout of the circuit design;

determining the at least one post-OPC model error correction to apply, the at least one post-OPC model error correction to apply determined based on the fabricated wafer data and the post-OPC pattern classification; and applying the at least one post-OPC model error correction to the digital layout of the circuit design.

19. A system comprising:

a memory; and a processor in communication with the memory, wherein the system is configured to perform a method comprising:

obtaining a digital layout of a circuit design;

obtaining proximity compensation data generated based on measurements of formed reticle elements, the proximity compensation data comprising proximity correction values to correct for proximity effects of a reticle-formation process to form a reticle for use in fabricating a circuit of the circuit design; and applying, based on a pattern classification of one or more patterns in the digital layout of the circuit design, at least one proximity correction to the digital layout of the circuit design to facilitate correcting for proximity effects of the reticle-formation process, the at least one proximity correction being determined based on one or more of the proximity correction values of the obtained proximity compensation data.

20. The system of claim 19, wherein the system comprises one or more systems of a mask house for manufacturing the reticle, the one or more systems of the mask house performing the obtaining the digital layout of the circuit design, obtaining the proximity compensation data, and applying the at least one proximity correction to the digital layout of the circuit design, and wherein the method further comprises performing, by the one or more systems of the mask house, a critical area compensation process comprising:

identifying critical areas in the digital layout of the circuit design; and applying one or more compensations to the digital layout of the circuit design based on identifying the critical areas, wherein the identifying the critical areas and the applying the one or more compensations are performed subsequent to an Optical Proximity Correction (OPC) of the digital layout of the circuit design and a Graphic Data System output (GDSout) of the digital layout of the circuit design, in order to isolate the one or more compensations to correction for the reticle-formation process rather than a modification of the circuit design.

\* \* \* \* \*